United States Patent
Crook et al.

(10) Patent No.: US 9,165,762 B2
(45) Date of Patent: Oct. 20, 2015

(54) METHOD OF DEPOSITING SILICONE DIOXIDE FILMS

(71) Applicant: SPTS TECHNOLOGIES LIMITED, Newport (GB)

(72) Inventors: Kathrine Crook, South Gloucestershire (GB); Andrew Price, Gwent (GB); Mark Carruthers, Gwent (GB); Daniel Archard, Glamorgan (GB); Stephen Burgess, Gwent (GB)

(73) Assignee: SPTS TECHNOLOGIES LIMITED, Newport (GB)

( * ) Notice: Subject to any disclaimer, the term of this patent is extended or adjusted under 35 U.S.C. 154(b) by 155 days.

(21) Appl. No.: 13/869,369

(22) Filed: Apr. 24, 2013

(65) Prior Publication Data

US 2013/0288486 A1    Oct. 31, 2013

Related U.S. Application Data

(60) Provisional application No. 61/638,598, filed on Apr. 26, 2012.

(30) Foreign Application Priority Data

Apr. 26, 2012 (GB) .................................. 1207448.0

(51) Int. Cl.
  *H01L 21/316* (2006.01)
  *H01L 21/02* (2006.01)
  *C23C 16/40* (2006.01)
  *C23C 16/505* (2006.01)
  *C23C 16/56* (2006.01)

(52) U.S. Cl.
  CPC ........ *H01L 21/02274* (2013.01); *C23C 16/402* (2013.01); *C23C 16/505* (2013.01); *C23C 16/56* (2013.01); *H01L 21/0234* (2013.01); *H01L 21/02164* (2013.01)

(58) Field of Classification Search
  CPC .................... H01L 21/02274; H01L 21/02164
  USPC .................................................. 438/787, 788
  See application file for complete search history.

(56) References Cited

U.S. PATENT DOCUMENTS

| | | | | |
|---|---|---|---|---|
| 5,382,550 A | * | 1/1995 | Iyer | 438/784 |
| 5,593,741 A | | 1/1997 | Ikeda | |
| 5,939,831 A | * | 8/1999 | Fong | C23C 16/4405 134/1.1 |
| 6,001,728 A | * | 12/1999 | Bhan | C23C 16/401 257/E21.276 |
| 6,028,014 A | | 2/2000 | Sukjarev | |
| 6,037,274 A | * | 3/2000 | Kudo | C23C 16/401 257/E21.276 |
| 6,300,219 B1 | * | 10/2001 | Doan | H01L 21/76224 257/E21.546 |
| 6,565,759 B1 | * | 5/2003 | Chen | H01L 21/02129 216/16 |
| 6,750,137 B1 | * | 6/2004 | Maeda | H01L 21/02129 257/E21.241 |
| 6,867,086 B1 | | 3/2005 | Chen et al. | |
| 7,199,061 B2 | * | 4/2007 | Choi | H01L 21/02164 257/E21.19 |
| 2006/0211267 A1 | * | 9/2006 | Joshi | C23C 16/30 438/778 |
| 2007/0155137 A1 | * | 7/2007 | Joshi | C23C 16/308 438/478 |
| 2011/0318502 A1 | * | 12/2011 | Giles et al. | 427/535 |
| 2012/0118204 A1 | * | 5/2012 | Chu | C23C 16/505 106/287.28 |

* cited by examiner

FOREIGN PATENT DOCUMENTS

EP    2362003 A2    8/2011

*Primary Examiner* — Michele Fan
(74) *Attorney, Agent, or Firm* — Volentine & Whitt, PLLC

(57) ABSTRACT

A method of forming silicon dioxide films using plasma enhanced chemical vapor deposition (PECVD) uses tetra-ethyl orthosilicate (TEOS), oxygen or a source of oxygen, and hydrogen as precursors. The method can be carried out at low temperatures in a range of 125 to 175° C. which is useful for manufacturing wafers with through silicon vias.

7 Claims, 6 Drawing Sheets

METHOD OF DEPOSITING SILICONE DIOXIDE FILMS

The invention relates to a method of depositing silicon dioxide films using plasma enhanced chemical vapour deposition (PECVD) and more particularly using tetraethyl orthosilicate (TEOS).

Deposition of silicon dioxide from tetraethyl orthosilicate and oxygen is known. However, when the deposition temperature is 300° C. or below, the resulting silicon dioxide layer is susceptible to moisture reabsorption. This leads to a degradation of leakage current and isolation properties over time.

With the increase in demand for through silicon vias (TSVs) in silicon wafers comes the need to lower the deposition temperature. There are a number of potential integration schemes that can be used with through silicon vias (TSVs), some of which require the use of non-permanent bonding of the silicon wafer to a carrier wafer. The bonding adhesive will limit the temperature at which silicon dioxide is deposited as the bonding material can be degraded at temperatures currently used for depositing silicon dioxide.

European Patent Application No. 10275131.0 describes performing a hydrogen plasma treatment on the deposited film to reform the Si—H bonds on the surface of the film. This is carried out at 200° C. or below. However, lower deposition and plasma treatment temperatures are required to manufacture wafers with TSVs.

Therefore there is a need to provide a method of silicon oxide deposition at a lower temperature than previously performed and which overcomes the associated problems of moisture reabsorption.

The present invention provides a method of depositing a silicon dioxide film using PECVD in a chamber including supplying TEOS, oxygen, or a source thereof and hydrogen as precursors.

The incorporation of hydrogen as an active gas in the deposition cycle results in significant improvements in silicon dioxide film properties when compared to deposition cycles which do not include hydrogen.

The invention may be carried out at any suitable temperature, even at high temperatures. In an embodiment, the temperature of the chamber is between 100° C. and 500° C. In a further embodiment, the chamber is at a temperature between 100° C. and 250° C. In a yet further embodiment, the chamber is at a temperature between 125° C. and 175° C. These lower temperatures are suitable for manufacturing wafers with TSVs.

Pure oxygen can be used as a precursor gas or an oxygen source, such as N2O, can be used instead. Helium is used as a carrier gas for the TEOS.

Whilst the precursors can be used in any suitable quantities, the inventors have used a ratio of $O_2$:TEOS of 10-20:1 based on sccm.

The films made by the process disclosed herein can further undergo a hydrogen plasma post deposition treatment step as described in European Patent Application No. 10275131.0. This step further suppresses reabsorption of moisture and reduces the leakage current.

In an embodiment, the plasma is an RF induced plasma. The plasma may be produced by a high frequency component and a low frequency component. The high frequency component is 13.56 MHz and the power is selected from the range of 600-1200 W and the low frequency component is 375 KHz and the power is selected from the range of 300-500 W.

In an embodiment the precursors are supplied to the chamber using a showerhead. The showerhead may be a RF driven shower head used to supply RF power to the plasma. Preferably the RF driven showerhead is driven using a high frequency component and a low frequency component. The high frequency component is 13.56 MHz and the power is selected from the range of 600-1200 W and the low frequency component is 375 kHz to 2 MHz and the power is selected from the range of 300-500 W.

The invention may be performed in various ways and specific embodiments will now be described, by way of example, with reference to the accompanying drawings.

FIGS. 1a and 1b show FTIR spectra of the film produced by process A and B respectively as a function of time.

FIG. 2a shows a graph of the leakage current for a film made by process A. FIG. 2b shows a graph of the leakage current for process B where a hydrogen plasma post deposition treatment has been carried out. FIG. 2c shows a graph of a leakage current for a film made by process B where no hydrogen post plasma deposition treatment has been carried out.

Using an apparatus, a series of experiments were carried out using the following process conditions.

Process A: Chamber pressure 2000 mT, 1500 sccm $O_2$, 0 $H_2$; 66 sccm TEOS in 1000 sccm He, 666 W high frequency, 334 W low frequency, temperature 125° C.

Process B: Chamber pressure 3100 mT, 2300 sccm $O_2$, 155 sccm TEOS in 2000 sccm He, temperature 125° C., 1000 sccm $H_2$, High frequency 900 W, low frequency 400 W.

Process C: Chamber pressure 2500 mT, 2300 sccm $O_2$, 750 sccm $H_2$, temperature 175° C., 155 sccm TEOS in 500 sccm He, High frequency 1320 W, low frequency 495 W.

The rate of deposition for processes A, B and C is 298 nm/min, 709 nm/min and 702 nm/min respectively.

Figure 1A:
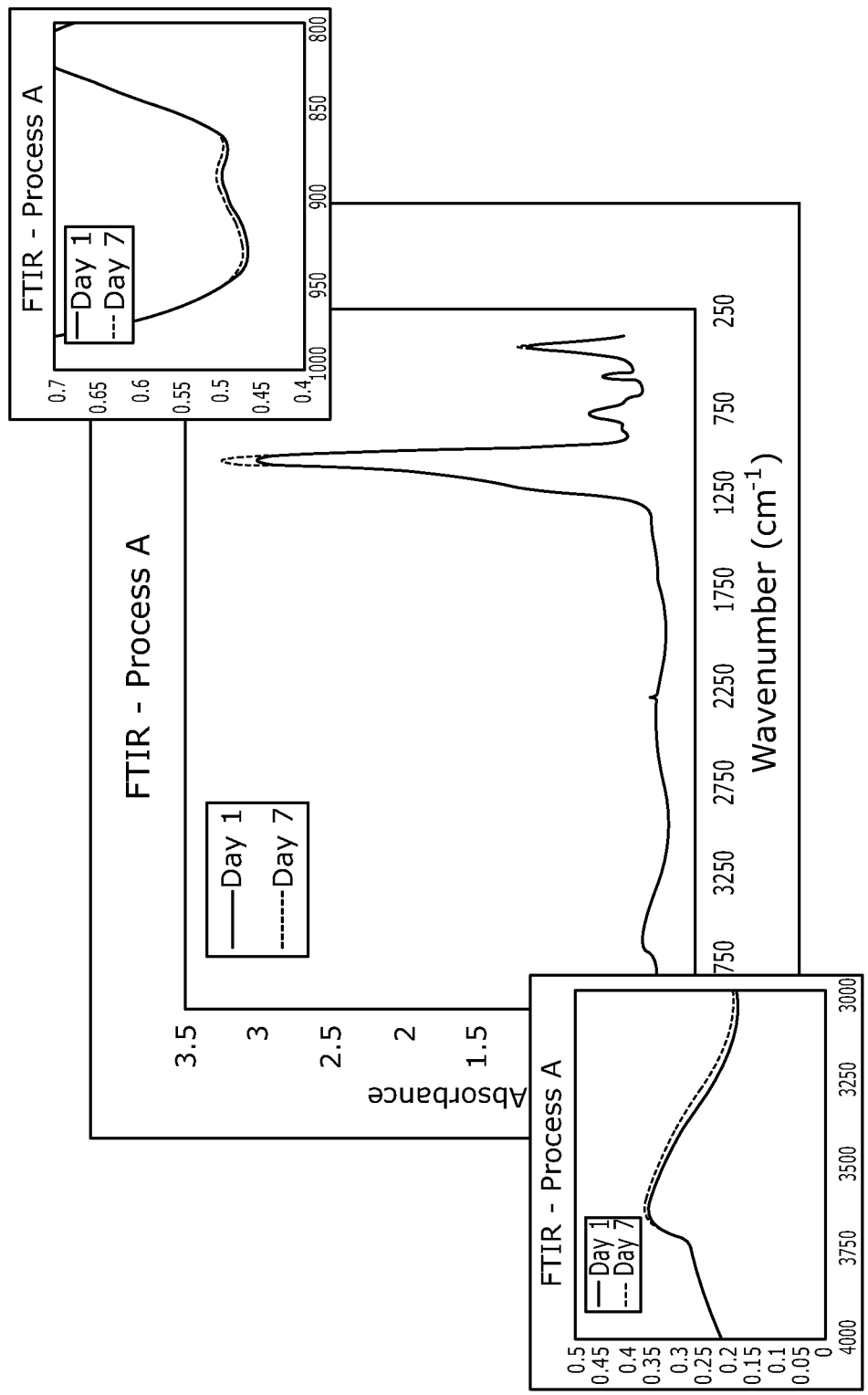
Figure 1B:
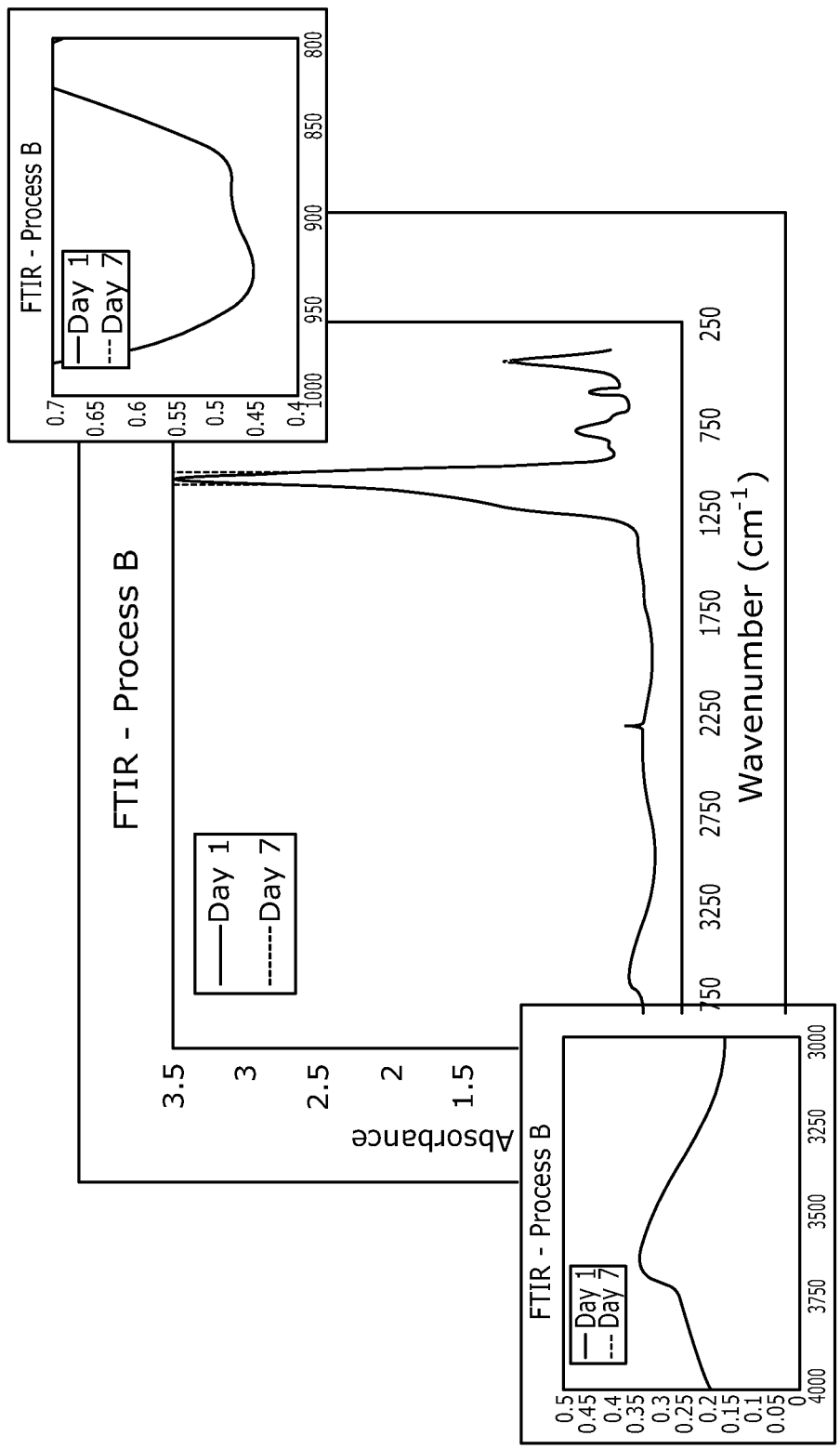

FIG. 1a shows a FTIR spectra of a film made by process A taken at the time of deposition and at one week later. It can be seen that the peaks at 890 cm-1 and 3400 cm-1 have broadened over the week. This broadening indicates low level moisture absorption. FIG. 1b shows FTIR spectra of a film made by process B. It can be seen that there has not been any shifting of peaks at 890 cm-1 and 3400 cm-1 which indicates that there has been no detectable moisture absorption. Both of the processes A and B were terminated with a hydrogen plasma post deposition treatment step at the same temperature as the deposition process.

Figure 2A:
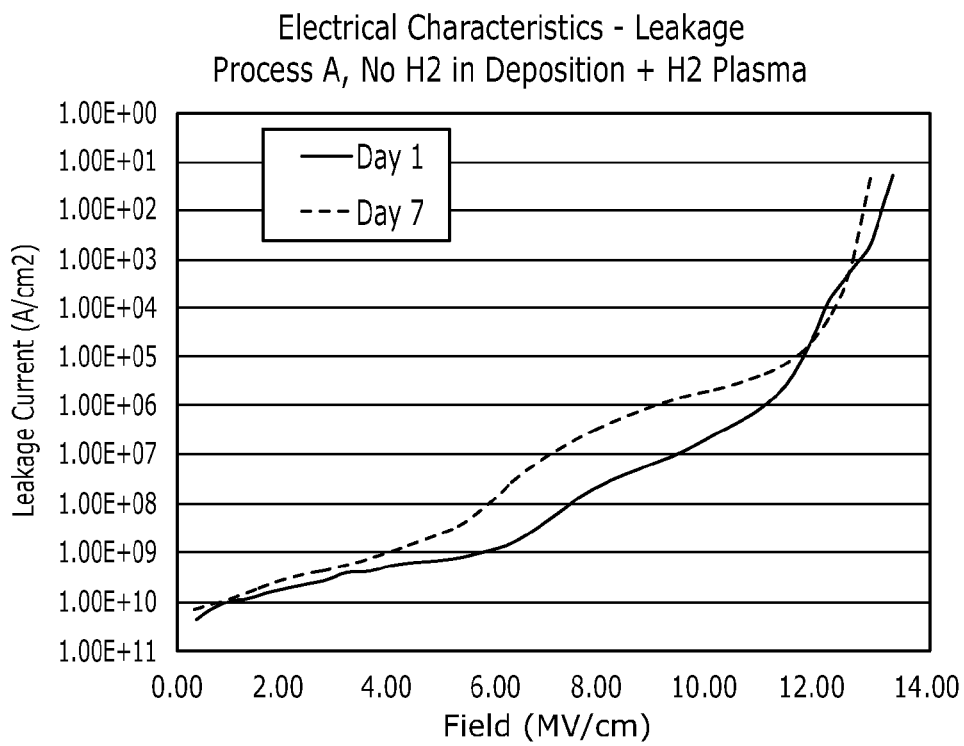
Figure 2B:
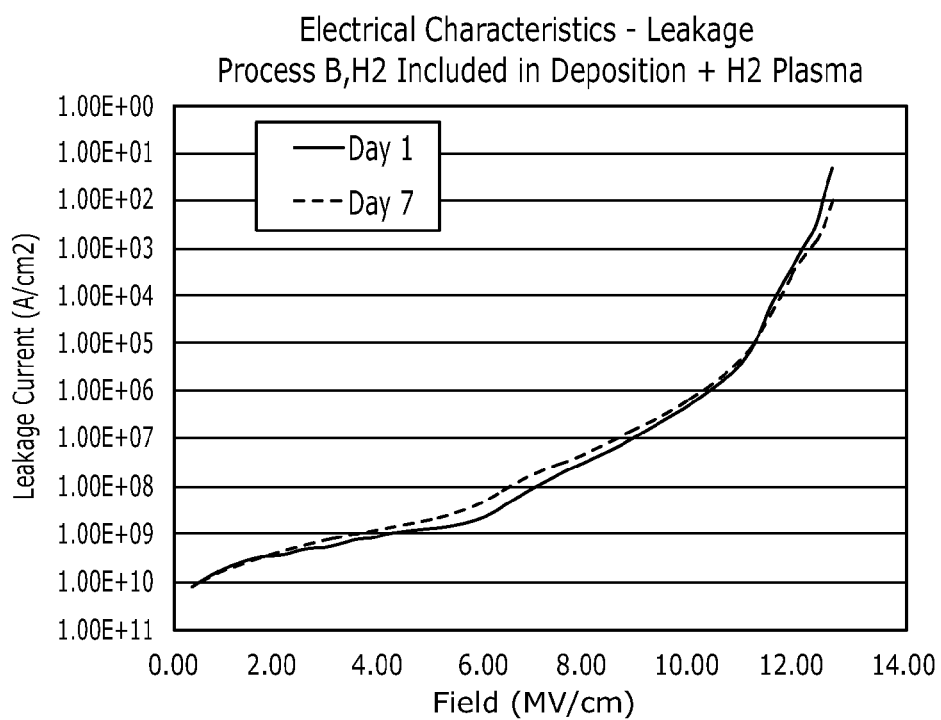
Figure 2C:
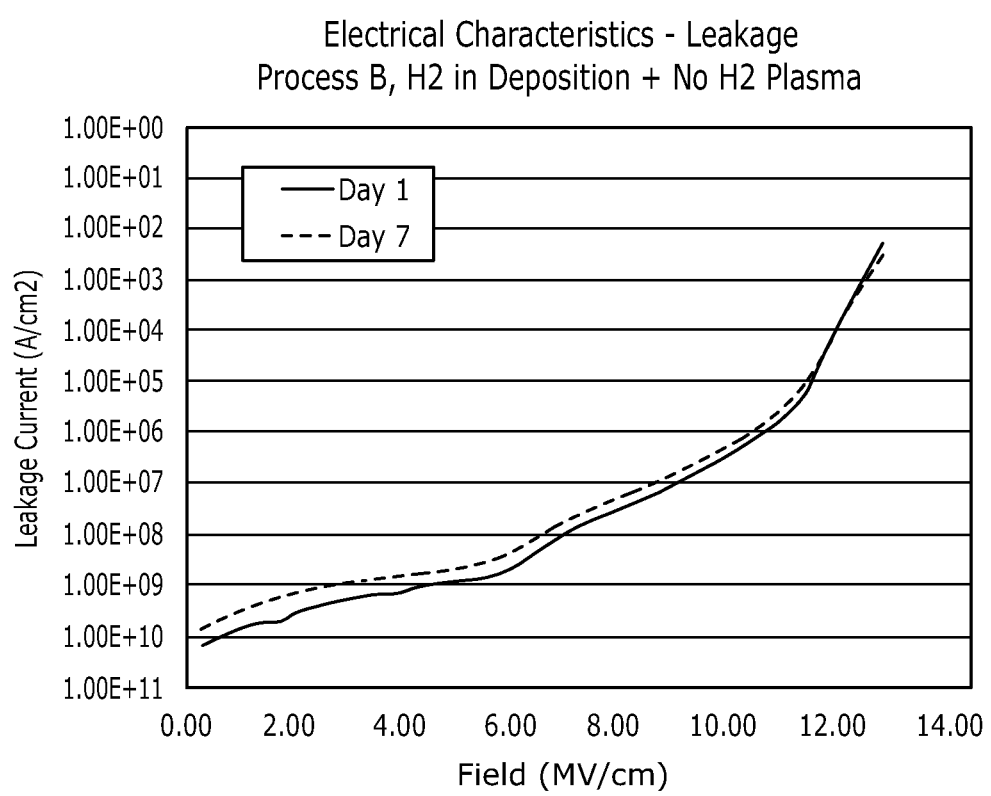

FIG. 2a shows a graph of the leakage current against applied field and exposure to atmosphere of a film made using process A with a hydrogen plasma post deposition treatment. A small rise around 6 MV/cm can be seen but there is no shift at 2 MV/cm which is a figure at which a viable device can work. FIG. 2b shows a graph of the leakage current for a film deposited using process B and which subsequently underwent a hydrogen plasma post deposition treatment step. It can be seen that there is no shift in leakage current at 2 MV/cm. FIG. 2c shows a graph of the leakage current plot for a film made by process B and which has not undergone a post deposition plasma treatment. It can be seen that despite the lack of this step there are improved leakage properties when compared to process A.

TABLE 1

| | Refractive Index | Stress (MPa) (compressive strength) | Leakage (no $H_2$ plasma) Day 7 | Leakage ($H_2$ plasma) Day 7 |
|---|---|---|---|---|
| Process A | 1.4627 | −105 | 4.70E−09 A/cm² @2 MV/cm  6.95E−07 A/cm² @6 MV/cm | 3.01E−09 A/cm² @2 MV/cm  1.39E−08 A/cm² @6 MV/cm |
| Process B | 1.4683 | −166 | 3.90E−09 A/cm² @2 MV/cm  1.33E−08 A/cm² @6 MV/cm | 2.76E−09 A/cm² @2 MV/cm  1.03E−08 A/cm² @6 MV/cm |

Table 1 above further demonstrates the results of the processes shown in FIGS. 2a, 2b and 2c. Also, an experiment using process A without a hydrogen plasma post deposition step is shown in the table.

Figure 3A:
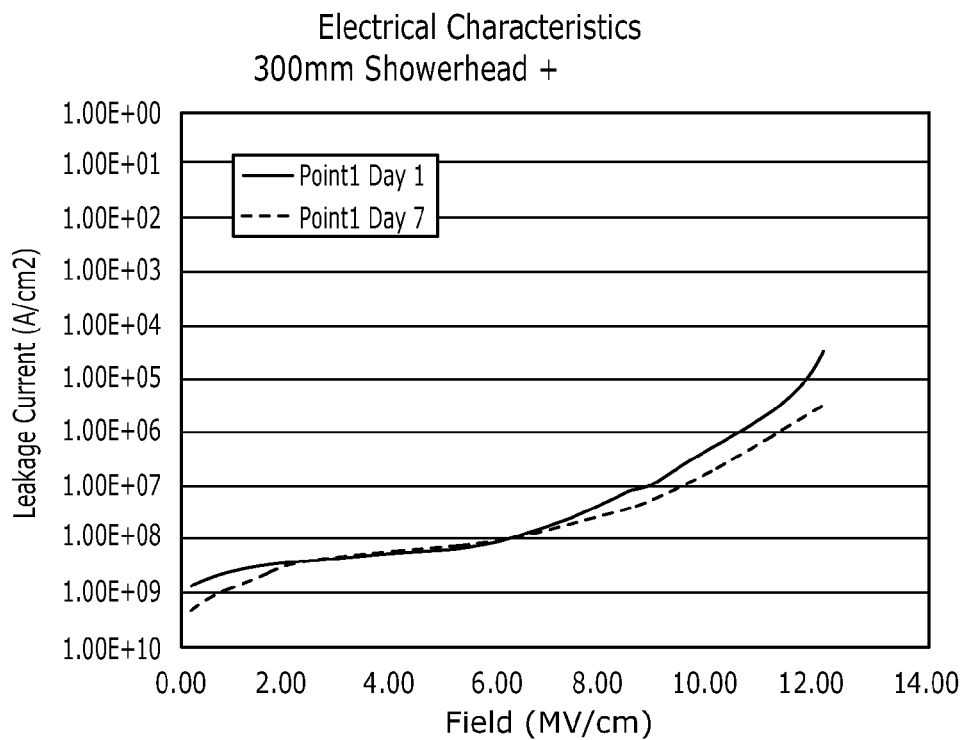
FIG. 3a shows a graph of the leakage current as a function of applied field for a film made by process C (i.e. with hydrogen in the deposition process).
Figure 3B:
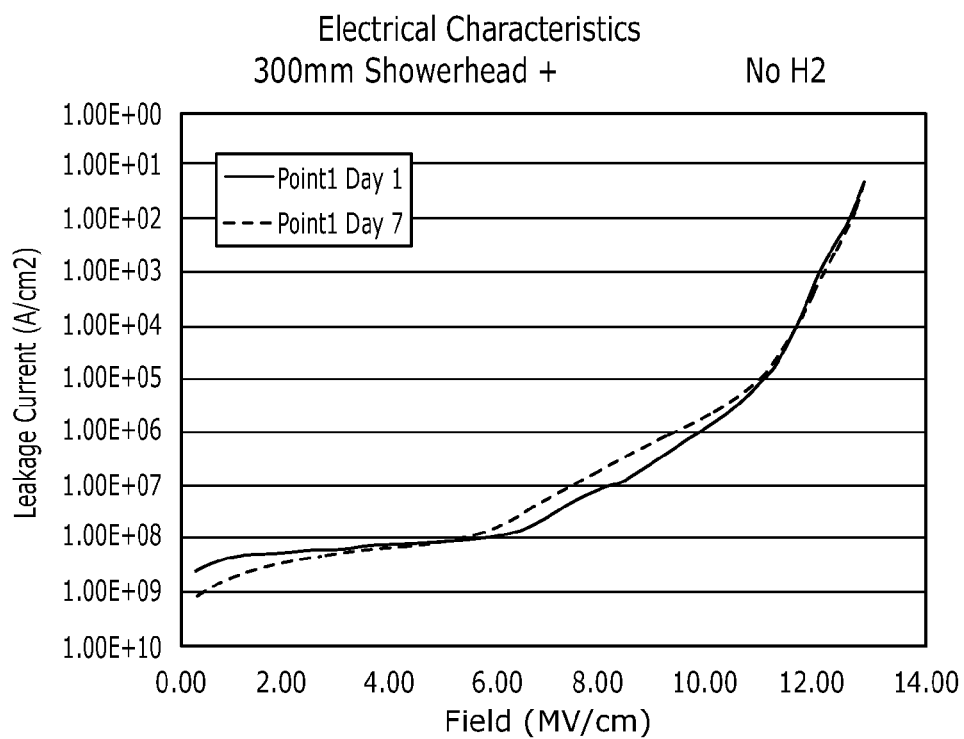
FIG. 3b shows a graph of the leakage current plot as a function of time for a process similar to Process C but without hydrogen in the deposition process.

FIG. 3a shows a graph of the leakage current as a function of applied field for a film made by process C. FIG. 3b shows a graph of the leakage current plot as a function of time for a process similar to Process C but without hydrogen in the deposition process. It can be seen from these two graphs that the leakage properties of the silicon dioxide film are improved when hydrogen is used in the deposition process at an elevated temperature.

Figure 4:
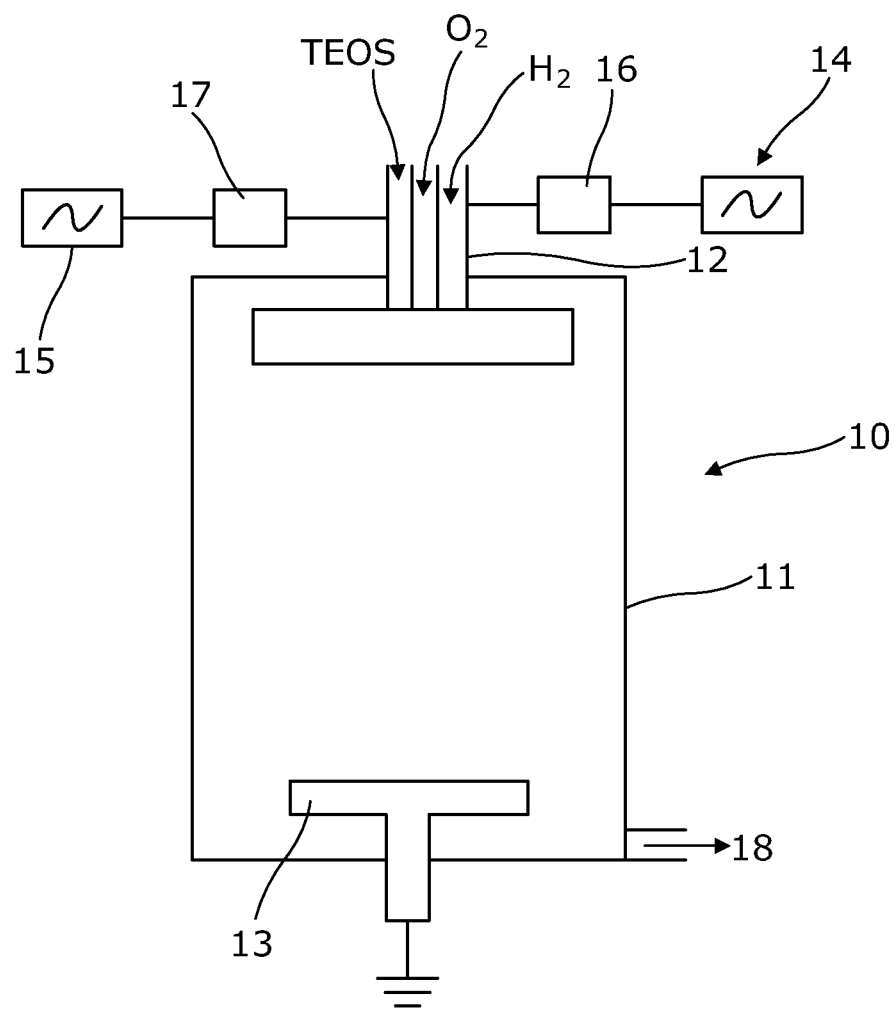
FIG. 4 shows a schematic drawing of the apparatus used for deposition.

FIG. 4 shows a schematic apparatus for performing the embodiments of the invention. The apparatus 10 comprises a chamber 11, a showerhead 12, a wafer support 13 and respective high and low frequency sources 14 and 15. The showerhead 12 is arranged to receive three precursors (TEOS in helium, $O_2$ or a source thereof and $H_2$). Matching units 16 and 17 are provided for the high and low frequency sources 14 and 15 respectively and a pumped outlet 18 is provided for removing surplus reaction gases.

A silicon dioxide (TEOS based) film deposited using $H_2$ as an active gas in the deposition cycle has been demonstrated. Furthermore, the method benefits from a high deposition rate and can be carried out at a low temperatures as well as higher, more standard temperatures. The addition of hydrogen in the deposition stage results in an improvement in electrical properties of the film and ensures they remain stable over time when compared to a film prepared by previously known process A due to the lack or moisture absorption. Further, the inventors believe that it is the inclusion of hydrogen in the deposition process that contributes to the in-situ densification of the film. This densification increases the refractive index and compressive strength as can be seen in table 1.

By including the hydrogen plasma post deposition step, the initial leakage current is further reduced and moisture reabsorption is suppressed.

For the avoidance of doubt, it is understood that where reference is made herein to features "including" one or more elements, the present specification also includes within its scope reference to such features "comprising", "consisting essentially" and "consisting of" said elements.

The invention claimed is:

1. A method of forming a silicon dioxide film on a substrate, including the steps of:
   supplying TEOS via a carrier gas, supplying oxygen or a source of oxygen, and supplying hydrogen as precursors to a chamber containing the substrate, wherein a ratio of a rate of flow of the carrier gas for the TEOS to a rate of flow of hydrogen, to the chamber, is in a range between 0.67:1 and 2:1;
   producing a plasma from the precursors; and
   performing plasma enhanced chemical vapour deposition using the plasma and while the temperature in the chamber is in a range of 125 to 175° C. to deposit silicon dioxide on the substrate.

2. A method according claim 1 further comprising treating the deposited silicon dioxide with a hydrogen plasma as a post deposition treatment.

3. A method according to claim 2 wherein the hydrogen plasma post deposition treatment is performed after a vacuum break.

4. A method according to claim 2 wherein the hydrogen plasma treatment is carried out at the same temperature as that at which the silicon dioxide is deposited on the substrate by the plasma enhanced chemical vapour deposition.

5. A method according to claim 2 wherein the plasma is produced by exciting the precursors with RF power having a high frequency RF component and a low frequency RF component.

6. A method according to claim 5 wherein the high frequency component is a component having a frequency of 13.56 MHz and power level in a range of 600 to 1200 W and the low frequency component is a component having a frequency of 350 kHz to 2 MHz and power level in a range of from 300 to 500 W.

7. A silicon dioxide film made according to a method as claimed in claim 1.

* * * * *

UNITED STATES PATENT AND TRADEMARK OFFICE
CERTIFICATE OF CORRECTION

PATENT NO. : 9,165,762 B2
APPLICATION NO. : 13/869369
DATED : October 20, 2015
INVENTOR(S) : Kathrine Crook et al.

Page 1 of 1

It is certified that error appears in the above-identified patent and that said Letters Patent is hereby corrected as shown below:

On the title page, at item (54) and in the specification, at column 1, line 1, change "SILICONE" to -- SILICON --.

Signed and Sealed this
Twenty-third Day of February, 2016

Michelle K. Lee
*Director of the United States Patent and Trademark Office*